United States Patent
Amemiya

(10) Patent No.: US 12,432,854 B2
(45) Date of Patent: Sep. 30, 2025

(54) PRINTED CIRCUIT BOARD AND DISK DEVICE

(71) Applicants: Kabushiki Kaisha Toshiba, Tokyo (JP); Toshiba Electronic Devices & Storage Corporation, Tokyo (JP)

(72) Inventor: Yoshihiro Amemiya, Chigasaki Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 273 days.

(21) Appl. No.: 18/178,877

(22) Filed: Mar. 6, 2023

(65) Prior Publication Data
US 2024/0040696 A1     Feb. 1, 2024

(30) Foreign Application Priority Data
Jul. 26, 2022    (JP) .................................. 2022-118811

(51) Int. Cl.
| | |
|---|---|
| *G11B 5/012* | (2006.01) |
| *H05K 1/11* | (2006.01) |
| *H05K 3/10* | (2006.01) |

(52) U.S. Cl.
CPC .............. *H05K 1/111* (2013.01); *G11B 5/012* (2013.01); *H05K 1/115* (2013.01); *H05K 3/103* (2013.01); *H05K 2201/0302* (2013.01); *H05K 2201/0753* (2013.01)

(58) Field of Classification Search
None
See application file for complete search history.

(56) References Cited

U.S. PATENT DOCUMENTS

| | | | | |
|---|---|---|---|---|
| 5,617,865 | A | * 4/1997 | Palczewska | B06B 1/0629 29/25.35 |
| 6,396,665 | B1 | 5/2002 | Asano | |
| 8,294,264 | B2 | * 10/2012 | Wang | H01L 24/05 257/737 |
| 9,040,837 | B2 | * 5/2015 | Takahashi | H05K 1/0298 174/250 |
| 11,074,931 | B1 | * 7/2021 | Aoki | G11B 25/043 |
| 2009/0101397 | A1 | * 4/2009 | Kuo | H05K 3/3447 174/250 |
| 2011/0101349 | A1 | * 5/2011 | Oda | H01L 24/92 257/E23.08 |
| 2011/0108981 | A1 | * 5/2011 | Rahim | H01L 23/3171 257/737 |

(Continued)

*Primary Examiner* — William J Klimowicz
(74) *Attorney, Agent, or Firm* — Kim & Stewart LLP

(57) ABSTRACT

According to one embodiment, a printed circuit board includes a first conductive layer on an insulating layer, including connection pads, a first mounting pad, a second mounting pad, a second wiring connecting the first mounting pad and one of the connection pads, and a first reinforcing pattern extending from the second mounting pad, a second conductive layer on another surface of the insulating layer, including a third wiring connected to one of the connection pads, and a conductive via connecting the second mounting pad and the third wiring. The second conductive layer includes a pad portion on the third wiring, opposed to the second mounting pad, and a third reinforcing pattern extending from the pad portion and opposed to the first reinforcing pattern.

11 Claims, 7 Drawing Sheets

(56) References Cited

U.S. PATENT DOCUMENTS

| | | | |
|---|---|---|---|
| 2019/0295600 A1* | 9/2019 | Yoshikawa | G11B 5/4853 |
| 2020/0305280 A1* | 9/2020 | Tokuda | H05K 1/118 |
| 2020/0315014 A1 | 10/2020 | Nishiyama et al. | |
| 2021/0090595 A1* | 3/2021 | Sato | H05K 1/116 |
| 2021/0225395 A1 | 7/2021 | Tokuda et al. | |
| 2021/0272593 A1 | 9/2021 | Tokizaki | |
| 2023/0062571 A1* | 3/2023 | Tokuda | H05K 1/189 |
| 2023/0215794 A1* | 7/2023 | Hong | H01L 21/4857 |
| | | | 257/676 |

* cited by examiner

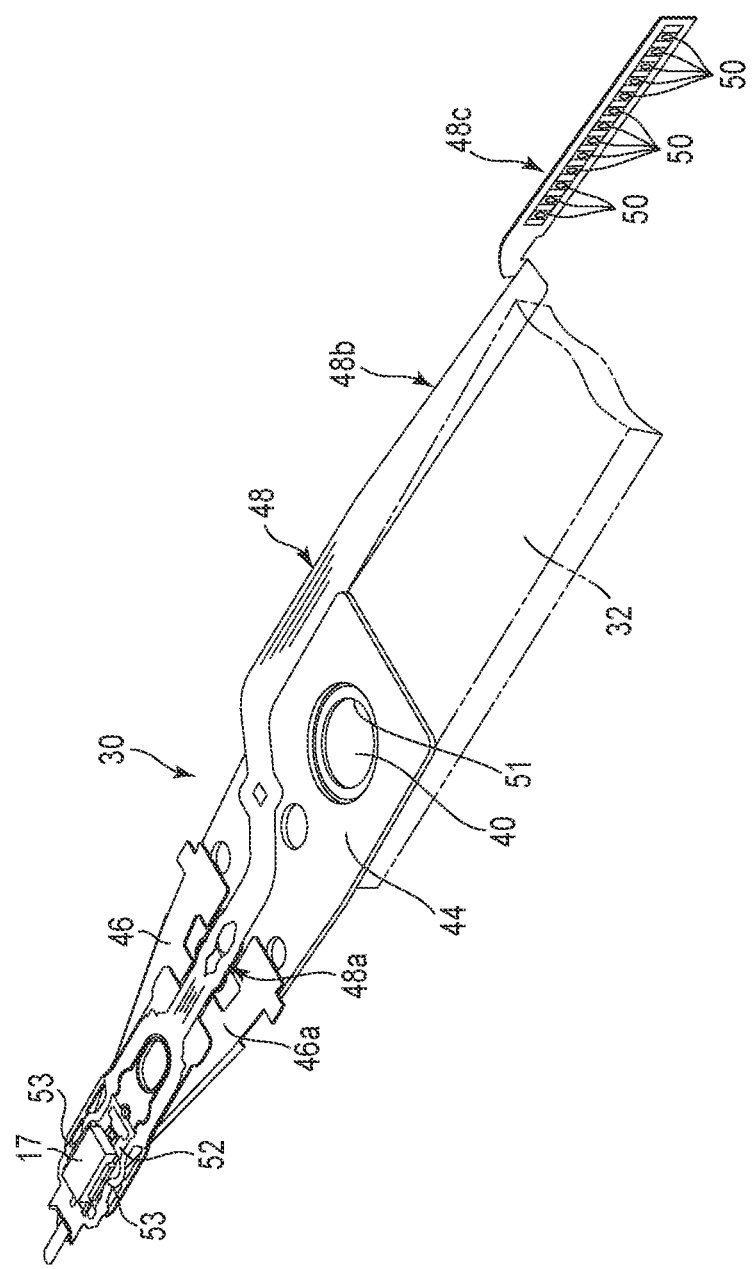
F I G. 3

PRINTED CIRCUIT BOARD AND DISK DEVICE

CROSS-REFERENCE TO RELATED APPLICATIONS

This application is based upon and claims the benefit of priority from Japanese Patent Application No. 2022-118811, filed Jul. 26, 2022, the entire contents of which are incorporated herein by reference.

FIELD

Embodiments described herein relate generally to a printed circuit board and a disk device.

BACKGROUND

As a disk device, for example, a magnetic disk device generally includes a magnetic disk disposed in a housing, a spindle motor which supports and rotates the magnetic disk, and a head actuator. The head actuator includes a plurality of suspension assemblies each supporting a magnetic head. Each suspension assembly includes a suspension attached to an arm of the head actuator and a wiring member (flexure) installed on the suspension. The magnetic head is supported by the gimbal portion of the wiring member.

A plurality of connection terminals is provided at the connection end portion of the wiring member. These connection terminals are electrically connected to the magnetic head through wiring of the wiring member. In addition, a flexible printed circuit board (FPC) is mounted on the actuator block of the head actuator. The FPC includes a large number of connection pads to which the connection terminals of the wiring member are joined, a large number of mounting pads on which electronic components such as a head IC are mounted, and a large number of wirings connected to the mounting pads.

In recent magnetic disk devices, multi-functionalization of each head and an increase in the number of heads have been studied in order to further increase a recording density and improve a reliability. Accordingly, it is necessary to increase the number of the wirings of the wiring member and the number of the connection terminals provided at the connection end portion. At the same time, it is necessary to increase the number of the connection pads, the number of the mounting pads, and the number of the wirings provided in the FPC.

However, it becomes difficult to further increase the number of the wirings and the number of the connection pads due to restrictions on the dimensions and installation space of the FPC. In addition, an increase in the number of the wirings may hinder downsizing of the head IC.

BRIEF DESCRIPTION OF THE DRAWINGS

FIG. 3 is a perspective view illustrating a suspension assembly of the actuator assembly.

DETAILED DESCRIPTION

Figure 1:
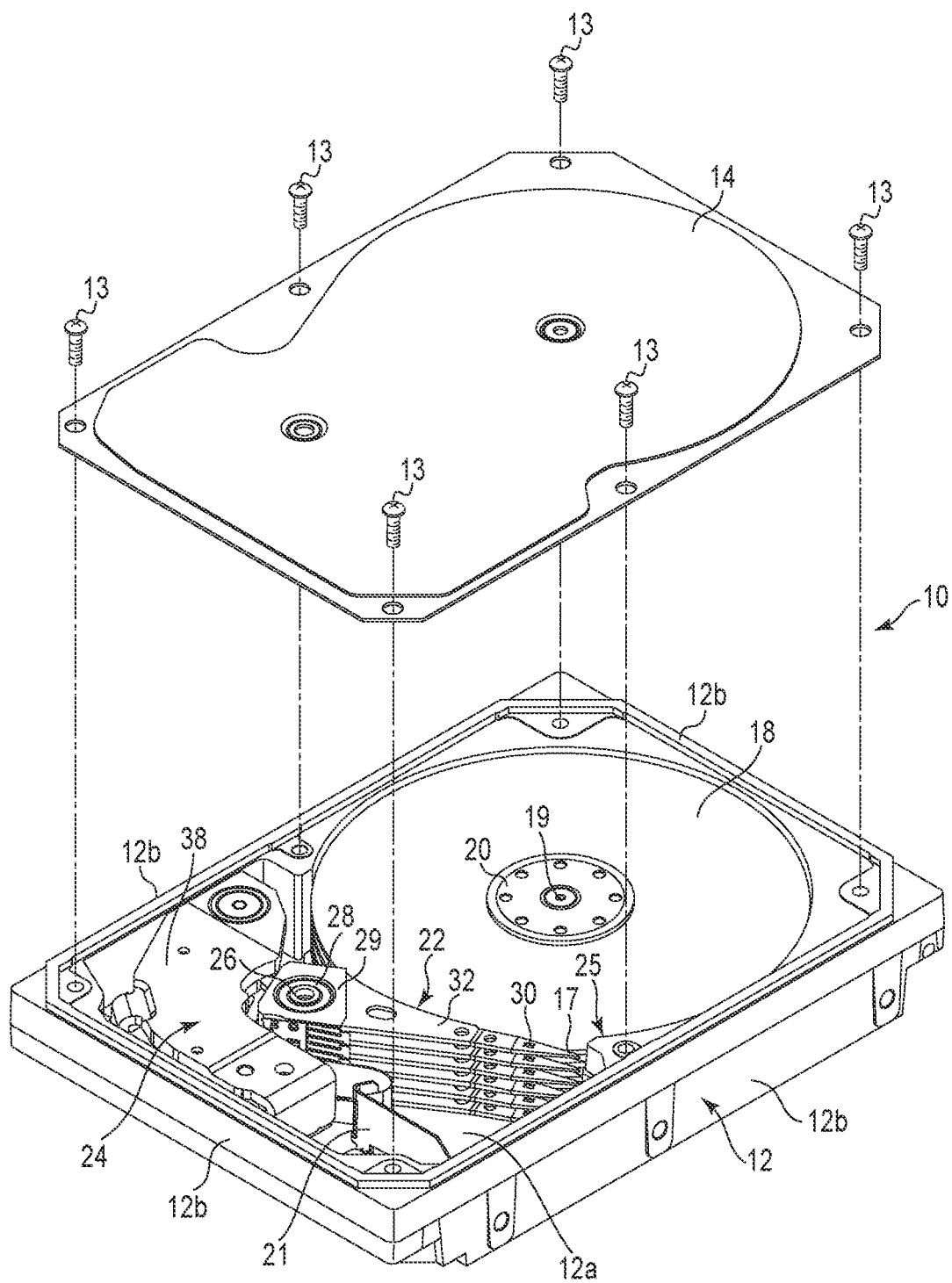
FIG. 1 is an exploded perspective view of a hard disk drive (HDD) according to an embodiment.

Various embodiments will be described hereinafter with reference to the accompanying drawings. In general, according to one embodiment, a printed circuit board comprises an insulating layer; a first conductive layer which is provided on one surface of the insulating layer and includes connection pads, a first mounting pad, a second mounting pad, and a second wiring connecting the first mounting pad and one of the connection pads; a second conductive layer which is provided on another surface of the insulating layer and includes a third wiring connected to one of the connection pads; and a conductive via which is provided penetrating the second conductive layer and the insulating layer and connects the second mounting pad and the third wiring. The first conductive layer includes a first reinforcing pattern extending from the second mounting pad in a direction different from a direction of the third wiring, and the second conductive layer includes a pad portion provided on the third wiring and opposed to the second mounting pad with the insulating layer interposed therebetween, and a third reinforcing pattern extending from the pad portion and opposed to the first reinforcing pattern with the insulating layer interposed therebetween.

Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

Embodiment

As a disk device, a hard disk drive (HDD) according to an embodiment will be described in detail.

FIG. 1 is an exploded perspective view of the HDD according to the embodiment in which a top cover is illustrated in an exploded manner.

As illustrated in the drawing, the HDD includes a flat substantially rectangular housing 10. The housing 10 includes a rectangular box-shaped base 12 having an open upper surface, and a top cover 14. The base 12 has a rectangular bottom wall 12a which faces the top cover 14 with a gap, and a plurality of side walls 12b which are provided upright along the periphery of the bottom wall 12a, and, for example, is integrally molded of aluminum. The top cover 14 is formed of, for example, stainless steel into a rectangular plate shape. The top cover 14 is screwed onto the side wall 12b of the base 12 with a plurality of screws 13 to close the upper opening of the base 12.

A plurality of magnetic disks 18 as recording media and a spindle motor 19 as a drive unit for supporting and rotating the magnetic disks 18 are provided in the housing 10. The spindle motor 19 is disposed on the bottom wall 12a. Each magnetic disk 18 includes, for example, a substrate formed in a disk shape with a diameter of 96 mm (3.5 inches) and a magnetic recording layer formed on the upper surface and/or lower surface of the substrate. The substrate is formed of a non-magnetic material, for example, glass or aluminum. The magnetic disk 18 is coaxially fitted to a hub (not illustrated) of the spindle motor 19 and is fixed to the hub by a clamp spring 20. The magnetic disk 18 is supported in the state of being positioned in parallel with the bottom wall 12a of the base 12. The magnetic disk 18 is rotated at a predetermined rotation speed by the spindle motor 19. Note that in this embodiment, for example, five magnetic disks 18 are housed in the housing 10, but the number of magnetic disks 18 is not limited thereto and can be increased or decreased.

A plurality of magnetic heads 17 for writing and reading information on the magnetic disk 18 and an actuator assembly (carriage assembly) 22 movably supporting the magnetic heads 17 with respect to the magnetic disk 18 are provided in the housing 10. In addition, a voice coil motor (hereinafter referred to as VCM) 24 which rotates and positions the actuator assembly 22, a ramp load mechanism 25 which holds the magnetic head 17 at an unload position apart from the magnetic disk 18 when the magnetic head 17 moves to the outermost periphery of the magnetic disk 18, and a board unit (FPC unit) 21 on which electronic components such as a conversion connector are mounted are provided inside the housing 10. The actuator assembly 22 and the VCM 24 configure a head actuator.

The actuator assembly 22 includes an actuator block 29 rotatably supported around a support shaft 26, a plurality of arms 32 extending from the actuator block 29, and suspension assemblies 30 extending from respective arms 32. The support shaft 26 is provided upright on the bottom wall 12a. The actuator block 29 is supported on the support shaft 26 through the bearing unit 28. The magnetic head 17 is supported at the distal end portion of each suspension assembly 30. The magnetic head 17 includes a read head, a write head, an assist element, a heater, and the like.

A printed circuit board (not illustrated) is screwed to the outer surface of the bottom wall 12a of the base 12. The printed circuit board configures a control unit, and this control unit controls the operation of the spindle motor 19 and controls the operation of the VCM 24 and the magnetic head 17 through the board unit 21.

Figure 2:
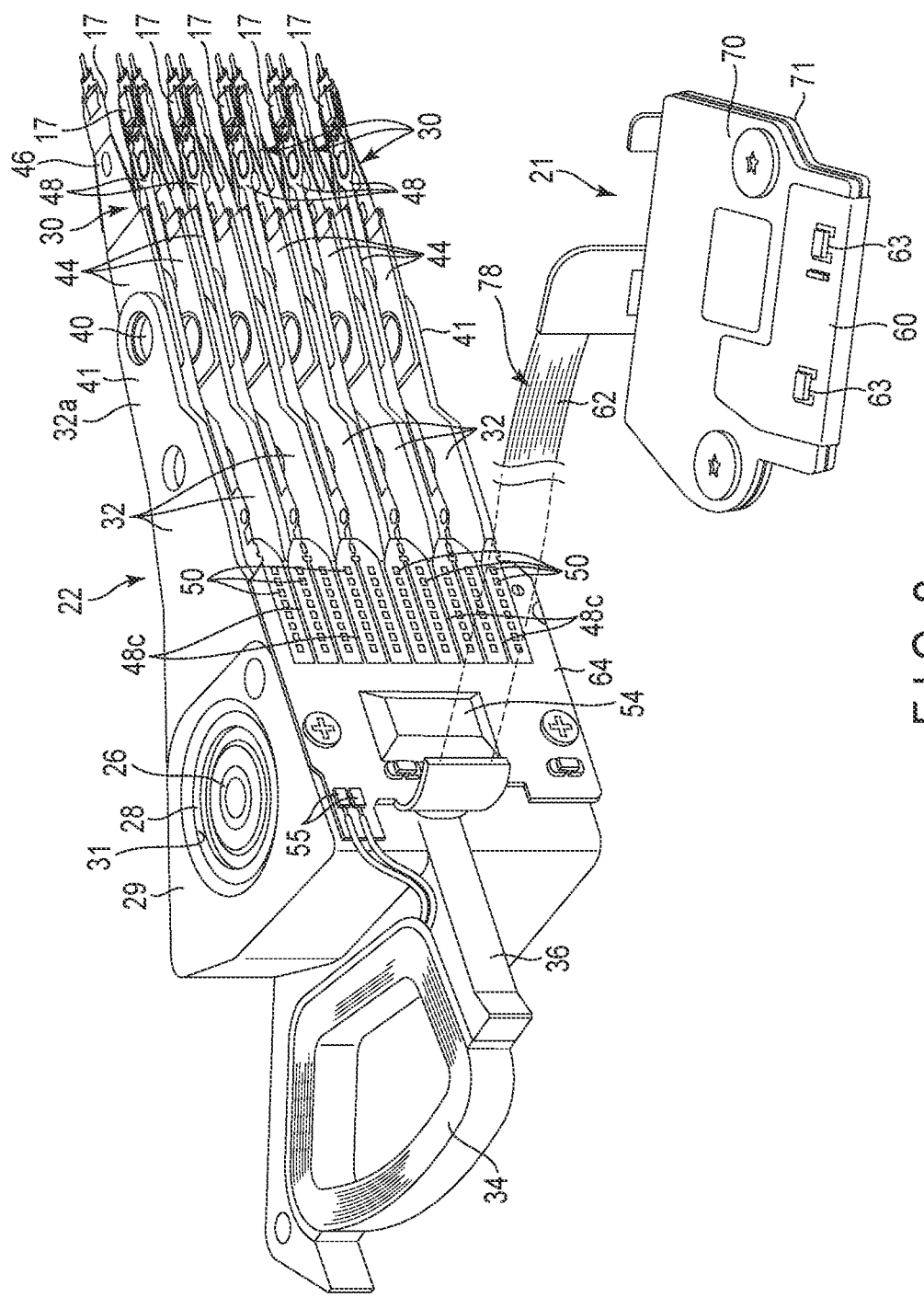
FIG. 2 is a perspective view illustrating an actuator assembly and a board unit (FPC unit) of the HDD.

FIG. 2 is a perspective view illustrating the actuator assembly and the FPC unit, and FIG. 3 is a perspective view illustrating the suspension assembly. As illustrated in FIG. 2, the actuator assembly 22 includes an actuator block 29 having a through hole 31, a bearing unit (unit bearing) 28 provided in the through hole 31, a plurality of, for example, six arms 32 extending from the actuator block 29, suspension assemblies 30 attached to respective arms 32, and a magnetic head 17 supported by the suspension assembly 30. The actuator block 29 is rotatably supported around the support shaft (pivot) 26 by the bearing unit 28.

In this embodiment, the actuator block 29 and the six arms 32 are integrally molded of aluminum or the like to form a so-called E block. The arm 32 is, for example, formed in an elongated flat plate shape and extends from the actuator block 29 in a direction orthogonal to the support shaft 26. The six arms 32 are provided in parallel with each other with a gap therebetween.

The actuator assembly 22 has a support frame 36 extending from the actuator block 29 in a direction opposite to the arm 32, and the voice coil 34 is supported by the support frame 36. As illustrated in FIG. 1, the voice coil 34 is positioned between a pair of yokes 38 one of which is fixed on the base 12, and configures the VCM 24 together with the yokes 38 and a magnet fixed to any one of the yokes.

The actuator assembly 22 includes ten suspension assemblies 30 each supporting the magnetic head 17, and these suspension assemblies 30 are attached to the distal end portions 32a of the arms 32, respectively. A plurality of suspension assemblies 30 include up-head suspension assemblies which support the magnetic heads 17 upward and down-head suspension assemblies which support the magnetic heads 17 downward.

As illustrated in FIG. 3, the suspension assembly 30 includes a substantially rectangular base plate 44, an elongated leaf spring-shaped load beam 46, and an elongated strip-shaped flexure (wiring member) 48. The proximal end portion of the load beam 46 is fixed to the end portion of the base plate 44 in an overlapping manner. The load beam 46 extends from the base plate 44 and is formed to be tapered toward the extension end. The base plate 44 and the load beam 46 are formed of stainless steel, for example, and configure a support plate (suspension).

The base plate 44 has a circular opening at the proximal end portion thereof and an annular protrusion 51 positioned around the opening. The base plate 44 is fastened to the distal end 32a of the arm 32 by fitting the protrusion 51 of the base plate 44 into a caulking hole 40 formed in the distal end portion 32a of the arm 32 and caulking the protrusion 51 (see FIG. 2). The proximal end portion of the load beam 46 is arranged to overlap the distal end portion of the base plate 44, and is fixed to the base plate 44 by welding at a plurality of positions.

The flexure 48 of the suspension assembly 30 includes a metal plate (backing layer) made of stainless steel or the like as a base and a flexible printed wiring board (FPC) installed on the metal plate, and forms an elongated strip-shaped laminated plate.

The flexure 48 has a distal end side portion 48a and a proximal end side portion 48b. The distal end side portion 48a is attached to the load beam 46 and the base plate 44. The proximal end side portion 48b extends outward from the side edge of the base plate 44, and further extends to the proximal end portion (actuator block 29) of the arm 32 along the arm 32.

The distal end side portion 48a of the flexure 48 has a displaceable gimbal portion (elastic support portion) 52 formed at the distal end portion thereof. The magnetic head 17 is mounted on the gimbal portion 52. A pair of piezoelectric elements 53 configuring a microactuator are mounted on the gimbal portion 52 and arranged on both sides of the magnetic head 17. The distal end portion of the flexure 48 is electrically connected to the read head element, the write head element, the heater, the assist element, the HDI sensor, and other members of the magnetic head 17, and the piezoelectric element 53 through wiring and a connection pad (not illustrated).

The flexure 48 has a connection end portion (tail connection end portion) 48c provided at one end of the proximal end side portion 48b. The connection end portion 48c is formed in an elongated rectangular shape. The connection end portion 48c is bent substantially at a right angle with respect to the proximal end side portion 48b and is positioned substantially perpendicular to the arm 32. A plurality of, for example, 13 connection terminals (connection pads) 50 are provided at the connection end portion 48c. These connection terminals 50 are connected to the wirings of the flexure 48, respectively. That is, a plurality of wirings of the flexure 48 extend over substantially the entire length of the flexure 48, one end is electrically connected to the magnetic head 17, and the other end is connected to the connection terminal (connection pad) 50 of the connection end portion 48c.

As illustrated in FIG. 2, the ten suspension assemblies 30 extend from the six arms 32, oppose to each other substantially in parallel, and are arranged side by side at predetermined intervals. These suspension assemblies 30 configure five down-head suspension assemblies and five up-head suspension assemblies. Each set of the down-head suspension assembly 30 and the up-head suspension assembly 30 are positioned in parallel with each other at a predetermined interval, and the magnetic heads 17 are positioned facing each other. These magnetic heads 17 are positioned to face both surfaces of the corresponding magnetic disk 18.

As illustrated in FIG. 2, the FPC unit 21 integrally includes a substantially rectangular base portion 60, an elongated strip-shaped relay portion 62 extending from one side edge of the base portion 60, and a substantially rectangular joint portion 64 provided continuously to the distal end portion of the relay portion 62. The base portion 60, the relay portion 62, and the joint portion 64 are formed of a flexible printed circuit board (FPC) 78.

Electronic components such as a conversion connector and a plurality of capacitors 63 (not illustrated) are mounted on one surface (outer surface) of the base portion 60, and are electrically connected to wirings (not illustrated). Two metal plates 70 and 71 functioning as reinforcing plates are attached to the other surface (inner surface) of the base portion 60. The base portion 60 is arranged on the bottom wall 12a of the housing 10, and is screwed to the bottom wall 12a by two screws. The conversion connector on the base portion 60 is connected to a control circuit board provided on the bottom surface side of the housing 10.

The relay portion 62 extends from the base portion 60 toward the actuator assembly 22. The joint portion 64 provided at the extension end of the relay portion 62 is formed in a rectangular shape having substantially the same height and width as the side surface (installation surface) of the actuator block 29. The joint portion 64 is attached to the installation surface of the actuator block 29 through a backing plate formed of aluminum or the like, and is further screwed and fixed to the installation surface with a fixing screw.

The connection end portions 48c of the ten flexures 48 are joined to a plurality of connection pads provided in the joint portion 64 and are electrically connected to the wirings of the joint portion 64. The plurality of connection end portions 48c are arranged side by side in a direction parallel with the support shaft 26. As an electronic component, for example, a head IC (head amplifier) 54 is mounted on the joint portion 64. The head IC 54 is connected to the connection end portion 48c and the base portion 60 through the connection pad and the wiring of the joint portion 64. Further, the joint portion 64 has a pair of connection pads 55, and the voice coil 34 is connected to these connection pads 55.

Ten magnetic heads 17 of the actuator assembly 22 are electrically connected to the base portion 60 through the wirings of the flexures 48, the connection end portions 48c, the joint portion 64 of the FPC unit 21, and the relay portion 62. Further, the base portion 60 is electrically connected to the printed circuit board on the bottom surface side of the housing 10 through the conversion connector.

Figure 4:
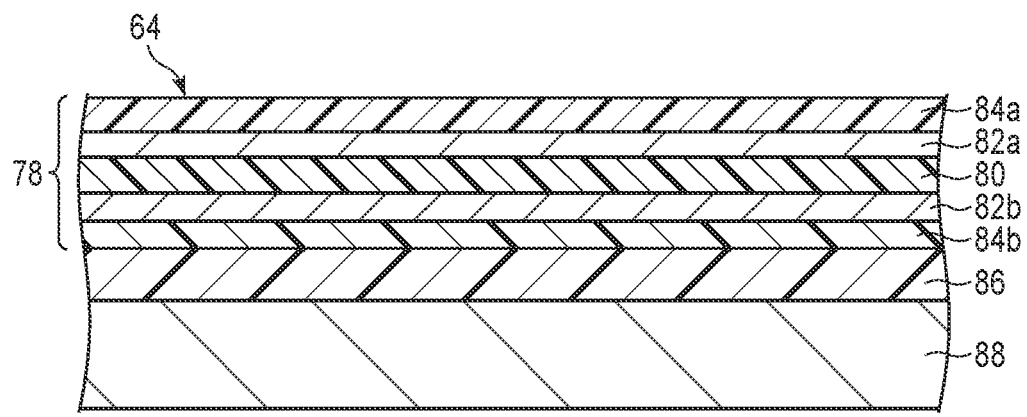
FIG. 4 is a cross-sectional view of a joint portion (FPC joint portion) of the FPC unit.

Next, the wiring structure of the joint portion 64 of the FPC 78 will be described in detail. FIG. 4 is a cross-sectional view of the joint portion of the FPC, and FIG. 5 is a side view illustrating the joint portion 64 before the tail connection end portion 48c is joined.

As illustrated in FIG. 4, the flexible printed circuit board 78 configuring the joint portion 64 includes a base insulating layer 80, a first conductive layer 82a laminated on one surface of the base insulating layer 80, a first protective insulating layer 84a laminated on the first conductive layer 82a, a second conductive layer 82b laminated on the other surface of the base insulating layer 80, and a second protective insulating layer 84b laminated on the second conductive layer 82b, and is configured as a multilayer circuit board. The base insulating layer 80 and the protective insulating layers 84a and 84b are formed of, for example, polyimide. The first conductive layer 82a is formed of, for example, a copper foil, and the copper foil is patterned to configure a plurality of wirings, connection pads, and mounting pads. Similarly, the second conductive layer 82b is formed of, for example, a copper foil, and the copper foil is patterned to configure a plurality of wirings and pads. In the joint portion 64, the side of the second protective insulating layer 84b is attached to the backing plate 88 by an adhesive layer (heat insulating layer) 86.

Figure 5:
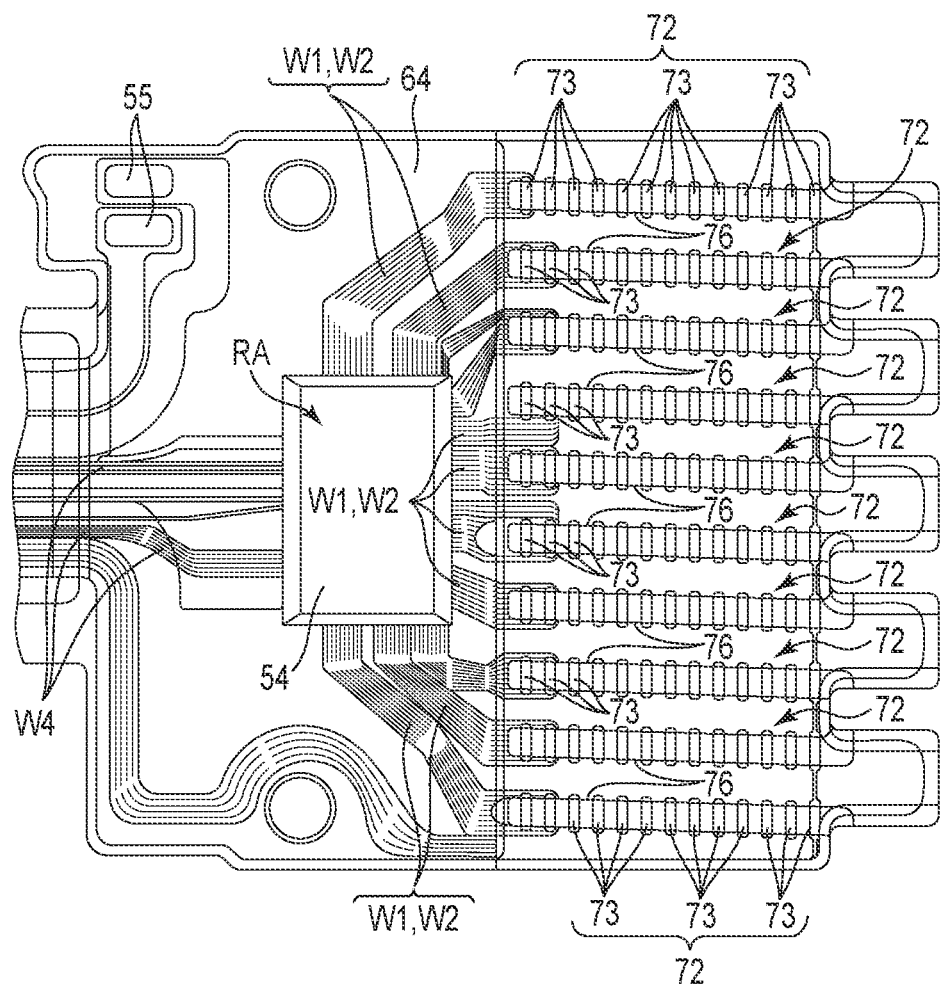
FIG. 5 is a side view of the joint portion of the FPC unit.

As illustrated in FIG. 5, the joint portion 64 includes a mounting region RA where the head IC 54 is mounted, and ten connection pad groups 72 to which the connection end portions 48c of the suspension assemblies 30 are connected. Each connection pad group 72 includes a plurality of, for example, 13 connection pads 73 arranged side by side in one row. A solder paste (not illustrated) is applied to each of the connection pads 73. The joint portion 64 includes a large number of mounting pads provided in the mounting region RA, a large number of first wirings W1 and second wirings W2 connecting the mounting pads and the connection pads 73, and a plurality of fourth wirings W4 connecting the mounting pads and the base portion 60 of the FPC.

The connection pad group 72, the mounting pad, the first wiring W1, the second wiring W2, and the fourth wiring W4 are formed of the first conductive layer 82a of the FPC 78, and the connection pad group 72 and the mounting pad are exposed to the outer surface of the joint portion 64. As described later, the joint portion 64 further includes a plurality of third wirings formed of the second conductive layer of the FPC 78.

Note that according to this embodiment, the first protective insulating layer 84a is removed in the mounting region RA.

Figure 6:
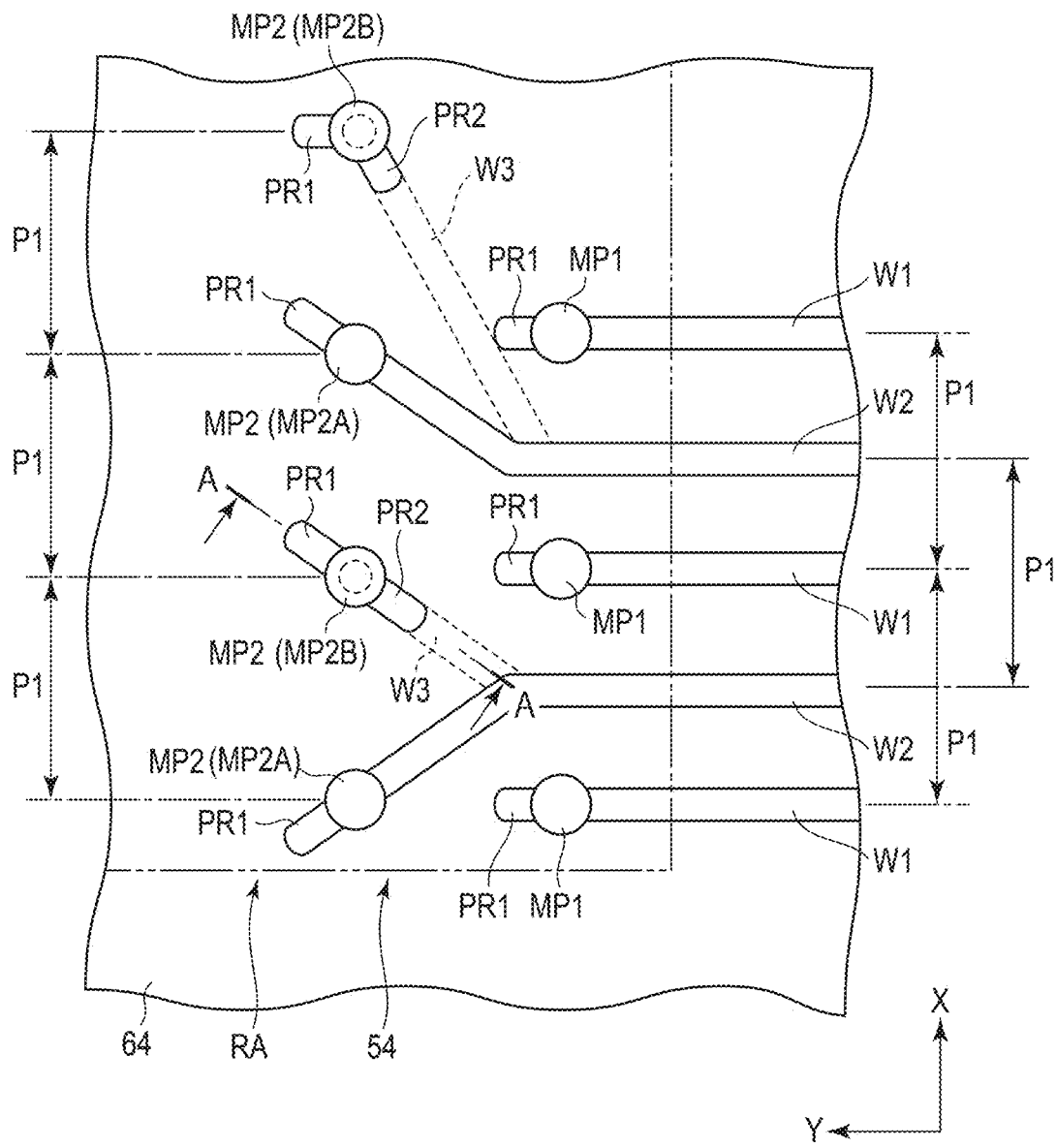
FIG. 6 is an enlarged plan view schematically illustrating a part of the joint portion.
Figure 9:
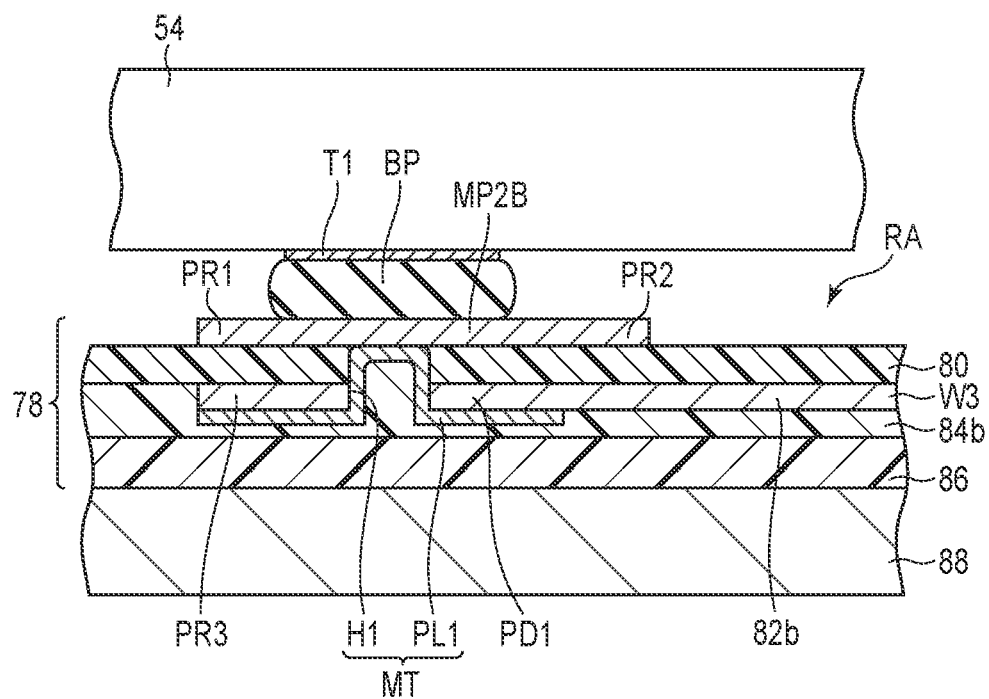
FIG. 9 is a cross-sectional view of the joint portion taken along line A-A in FIG. 6.

FIG. 6 is a plan view schematically illustrating the mounting pad and wiring in the joint portion 64 of the FPC, and FIG. 9 is a cross-sectional view of the joint portion 64 taken along line A-A in FIG. 6. As illustrated in FIG. 6, a plurality of mounting pads MP1 and MP2 are provided in the mounting region RA of the joint portion 64. The connection terminals of the head IC 54 are mounted on the mounting pads MP1 and MP2 through solder balls (bumps). In a case where a first direction is an X direction and a second direction orthogonal thereto is a Y direction, the mounting pads MP1 and MP2 are arranged side by side in a plurality of rows extending in the first direction X.

For example, the mounting pads MP1 in the first row are arranged at a predetermined pitch P1 in the first direction X. The mounting pad MP1 is connected to the first wiring W1 and is connected to the connection pad 73 through the first wiring W1. In the vicinity of the mounting region RA, the plurality of first wirings W1 extend in the second direction Y and are arranged at the predetermined pitch P1 in the first direction X.

The mounting pads MP2 in the second row are arranged at the predetermined pitch P1 in the first direction X. For example, every other mounting pad (first mounting pad) MP2A in the first direction X among the mounting pads MP2 in the second row is connected to the second wiring W2. The second wiring W2 is connected to the connection pad 73. In the vicinity of the mounting region RA, the plurality of second wirings W2 are arranged side by side at the predetermined pitch P1 in the first direction X, and are each positioned between two first wirings W1 adjacent in the first direction X. That is, the first wiring W1 and the second wiring W2 are arranged at a pitch P1/2 in the first direction X.

As illustrated in FIGS. 6 and 9, the joint portion 64 includes a plurality of third wirings W3 formed of the second conductive layer 82b of the lower layer. Among the mounting pads MP2 in the second row, another mounting pad (second mounting pad) MP2B is connected to the third wiring W3 of the lower layer through a blind via to be described later, and is connected to the connection pad 73 through the third wiring W3. In the vicinity of the mounting region RA, the plurality of third wirings W3 extend in the second direction Y and are arranged at the pitch P1 in the first direction X. Further, the plurality of third wirings W3 are arranged to overlap the second wiring W2 in the thickness direction of the FPC 78. That is, each of the plurality of third wirings W3 opposes the second wiring W2 with the insulating layer 80 interposed therebetween.

As illustrated in FIG. 6, the mounting pad MP1 is formed in a circular shape, for example, and includes a first reinforcing pattern PR1 extending substantially linearly from an outer peripheral edge thereof. The extending direction of the first reinforcing pattern PR1 is parallel with the extending direction of the first wiring W1 in the mounting region RA, and extends in a direction substantially opposite to the first wiring W1 with respect to the mounting pad MP1. The first reinforcing pattern PR1 is used to confirm the bondability (wettability) of the solder.

The mounting pad MP2A is formed in a circular shape, for example, and includes the first reinforcing pattern PR1 extending substantially linearly from an outer peripheral edge thereof. The first reinforcing pattern PR1 extends in a direction substantially opposite to the extending direction of the second wiring W2 with respect to the mounting pad MP2. The first reinforcing pattern PR1 is used to confirm the bondability (wettability) of the solder.

The mounting pad MP2B is formed in a circular shape, for example, and includes the first reinforcing pattern PR1 extending substantially linearly from an outer peripheral edge thereof. The extending direction of the first reinforcing pattern PR1 extends in a direction substantially opposite to the extending direction of the third wiring W3 in the mounting region RA.

According to this embodiment, the mounting pad MP2B further includes a second reinforcing pattern PR2. The second reinforcing pattern PR2 linearly extends from the outer peripheral edge of the mounting pad MP2B and is provided in a direction overlapping the third wiring W3.

The first reinforcing pattern PR1 and the second reinforcing pattern PR2 are used to confirm the bondability (wettability) of the solder.

In an example, the first wiring line W1, the second wiring line W2, the third wiring line W3, and the fourth wiring line W4 are formed to have the same line width. Further, the mounting pads MP1, MP2A, and MP2B are formed to have the same diameter.

Figure 7:
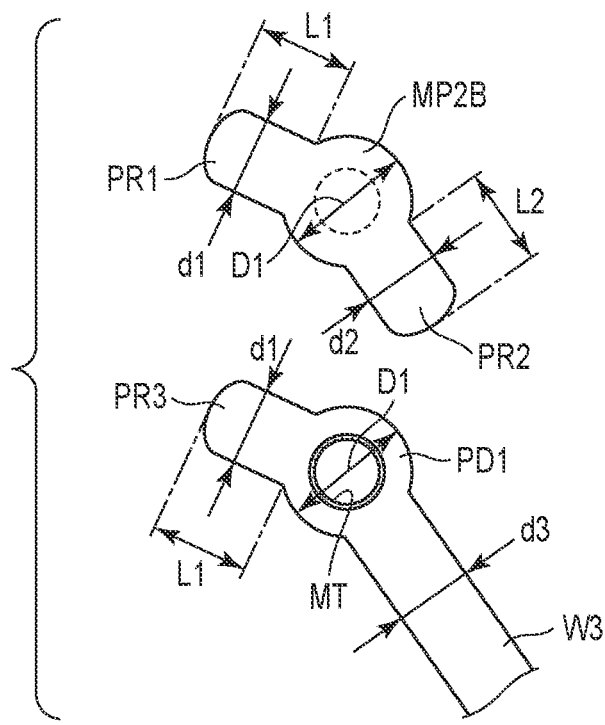
FIG. 7 is a plan view schematically illustrating a mounting pad and a lower layer wiring in the joint portion.
Figure 8:
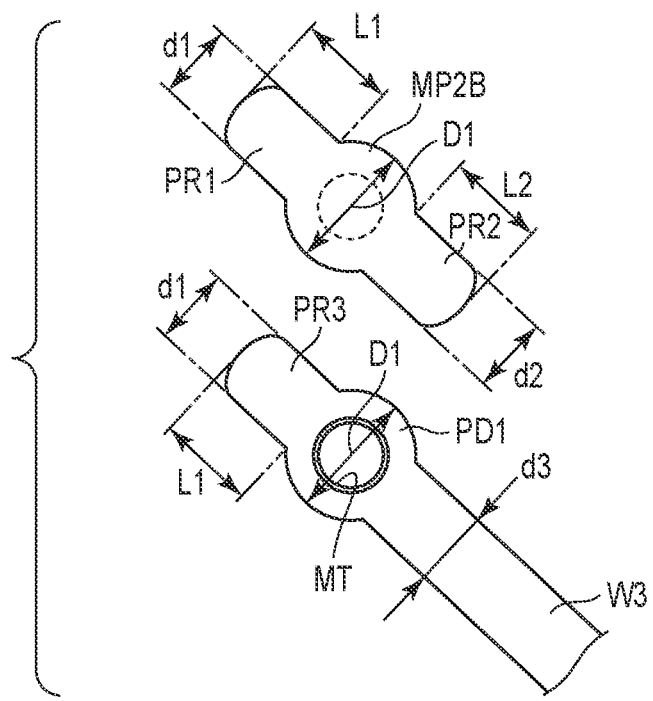
FIG. 8 is a plan view schematically illustrating another mounting pad and a lower layer wiring in the joint portion.

FIG. 7 is a plan view illustrating a shape and an arrangement relationship between one mounting pad MP2B and the third wiring W3, and FIG. 8 is a plan view illustrating a shape and an arrangement relationship between the other mounting pad MP2B and the third wiring W3.

As illustrated in FIG. 7, one mounting pad MP2B formed of the first conductive layer 82a integrally includes a circular pad and the first reinforcing pattern PR1 and the second reinforcing pattern PR2 extending in different directions from the outer peripheral edge of the pad. When the diameter of the mounting pad MP2B is defined as D1, a width d1 of the first reinforcing pattern PR1 is formed to be smaller than the diameter D1 (D1>d1), and is desirably formed to be about 50 to 90% of the diameter D1. A length L1 of the first reinforcing pattern PR1 in the extending direction is formed to be, for example, about 80 to 120% of the diameter D1.

A width d2 of the second reinforcing pattern PR2 is formed to be smaller than the diameter D1 (D1>d2), and is desirably formed to be about 50 to 90% of the diameter D1. A length L2 of the second reinforcing pattern PR2 in the extending direction is formed to be, for example, about 80 to 120% of the diameter D1. In this embodiment, the widths d1 and d2 of the first reinforcing pattern PR1 and the second reinforcing pattern PR2 are set to the same width as a line width d3 of the third wiring W3.

The third wiring W3 formed of the second conductive layer (lower layer) 82b integrally includes a circular pad portion PD1 corresponding to the mounting pad MP2B and a third reinforcing pattern PR3 linearly extending from the pad portion PD1. The pad portion PD1 and the third reinforcing pattern PR3 have substantially the same size and shape as the mounting pad MP2B and the first reinforcing pattern PR1, and are provided at positions overlapping the mounting pad MP2B and the first reinforcing pattern PR1 in the thickness direction of the FPC 78, respectively. In addition, the third wiring W3 itself has the same line width d3 as the second reinforcing pattern PR2 of the mounting pad MP2B, and is provided at a position overlapping the second reinforcing pattern PR2 in the thickness direction of the FPC 78. That is, the first reinforcing pattern PR1, the mounting pad MP2B, and the second reinforcing pattern PR2 oppose to the third reinforcing pattern PR3, the pad portion PD1, and the third wiring W3 with the insulating layer 80 interposed therebetween.

As illustrated in FIG. 8, another mounting pad MP2B formed of the first conductive layer 82a integrally includes a circular pad and the first reinforcing pattern PR1 and the second reinforcing pattern PR2 extending in different directions from the outer peripheral edge of the pad. The first reinforcing pattern PR1 extends from the mounting pad MP2B in a direction substantially opposite to the third wiring W3. Other shapes and dimensions of the mounting pad MP2B are formed to be the same as those of the mounting pad MP2B illustrated in FIG. 7.

As illustrated in FIG. 8, the third wiring W3 formed of the second conductive layer (lower layer) 82b integrally includes the circular pad portion PD1 corresponding to the mounting pad MP2B and the third reinforcing pattern PR3 linearly extending from the pad portion PD1. The third reinforcing pattern PR3 extends from the pad portion PD1 in a direction substantially opposite to the extending direction of the third wiring W3.

The pad portion PD1 and the third reinforcing pattern PR3 have substantially the same size and shape as the mounting pad MP2B and the first reinforcing pattern PR1, and are provided at positions overlapping the mounting pad MP2B and the first reinforcing pattern PR1 in the thickness direction of the FPC, respectively. In addition, the third wiring W3 has the same line width d3 as the second reinforcing pattern PR2 of the mounting pad MP2B, and is provided at a position overlapping the second reinforcing pattern PR2 in the thickness direction of the FPC.

As illustrated in FIG. 9, the mounting pad MP2B is positioned to overlap the pad portion PD1 of the third wiring W3. The pad portion PD1 is electrically connected to the mounting pad MP2B through a plating through hole (which may be referred to as a conductive via or a blind via) MT. Specifically, the plating through hole MT includes a through hole H1 formed through the base insulating layer 80 and the pad portion (second conductive layer) PD1, and a conductive metal plating layer PL1 laminated on the third wiring W3 to overlap the through hole H1. The through hole H1 does not penetrate the first conductive layer 82a and opposes substantially the center of the mounting pad MP2B. The plating layer PL1 is formed to overlap the pad portion PD1, the inner surface of the through hole, and the mounting pad MP2B. The mounting pad MP2B is electrically connected to the third wiring W3 of the lower layer through the plating through hole MT.

The first reinforcing pattern PR1 and the second reinforcing pattern PR2 formed of the first conductive layer 82a are arranged to overlap the third reinforcing pattern PR3 and the third wiring W3 of the lower layer in the thickness direction of the FPC, respectively. Therefore, the first reinforcing pattern PR1 and the second reinforcing pattern PR2 are kept in a plane substantially parallel with the second conductive layer 82b and the base insulating layer 80 without being inclined to the side of the second conductive layer 82b or without being stepped.

A head IC (preamplifier) 54 includes a plurality of connection pads T1 provided on the bottom surface thereof and solder balls (solder bumps) BP provided on the connection pads T1. The head IC 54 is placed on the mounting region RA of the joint portion 64, and each connection pad T1 is solder-joined to any of the corresponding mounting pads MP1, MP2A, and MP2B by the solder ball BP.

During solder joining, a part of the melted solder may flow from the mounting pad onto the first reinforcing pattern PR1 and/or the second reinforcing pattern PR2. Therefore, after the head IC 54 is mounted on the mounting region RA of the joint portion 64, the flowing-out state of the solder to the first reinforcing pattern PR1 and the second reinforcing pattern PR2 is confirmed, whereby the quality of the solder bonding can be determined. For example, when the solder excessively flows out to the reinforcing pattern, the amount of solder connecting the connection pad T1 of the head IC 54 is reduced, and connection failure may occur. Therefore, when the solder excessively flows out, it can be determined that the bondability of the solder is poor. In addition, when the solder flows out as appropriate, it can be determined that the solder bondability is excellent and a stable connection state can be secured.

Note that similarly to the above, another mounting pad MP2B is directly connected to the third wiring W3 of the lower layer through the plating through hole MT, and the first reinforcing pattern PR1 and the second reinforcing pattern PR2 are positioned to overlap the third reinforcing pattern PR3 and the third wiring W3 of the lower layer in the thickness direction.

According to the flexible printed circuit board of the HDD configured as described above, at least one or a plurality of mounting pads among the plurality of mounting pads MP provided in the mounting region RA is directly connected to the third wiring W3 of the second layer by the plating through hole (the conductive via or the blind via) MT. As a result, the number of first wirings W1 and second wirings W2 of the first layer can be reduced, and the space occupied by the wirings can be reduced. Since the size of the head IC 54 substantially depends on the number of wirings of the first layer, the size of the head IC 54 can be reduced with the reduction in the number of wirings and the reduction in the occupied space as described above. By reducing the head IC, the manufacturing cost can be reduced.

By providing the first reinforcing pattern PR1 and the second reinforcing pattern PR2 extending from the mounting pad MP, the bondability of the solder in the mounting pad MP can be easily confirmed. Further, the third wiring W3 of the second layer has a third reinforcing pattern PR3, and the first reinforcing pattern PR1 and the second reinforcing pattern PR2 of the first layer are arranged to overlap the third reinforcing pattern PR3 and the third wiring W3 of the second layer in the thickness direction. According to such a configuration, the first reinforcing pattern PR1 and the second reinforcing pattern PR2 are kept in a plane substantially parallel with the second conductive layer 82b without being inclined to the side of the second conductive layer 82b or without being stepped. This makes it possible to prevent the solder from excessively flowing out onto the first reinforcing pattern PR1 and the second reinforcing pattern PR2 at the time of solder joining, and to suppress the occurrence of connection failure.

As described above, according to this embodiment, it is possible to provide a printed circuit board capable of reducing the installation space of the wiring and improving the bondability of the mounting pad, and a disk device including the printed circuit board.

Note that the number of mounting pads, which are connected to the wiring of the lower layer through the plating through hole MT, among the mounting pads provided in the mounting region RA is not limited to the above-described embodiment, and can be increased or decreased as necessary. The number of wirings of the first layer and the number of wirings of the second layer can be arbitrarily adjusted. In addition, although the embodiment is described in which the first wiring W1, the second wiring W2, and the third wiring W3 extend from the mounting region RA in the second direction Y, it goes without saying that the extending direction of the wiring is not limited to the second direction Y, and includes wirings extending in another direction.

The arrangement pitch of the first wiring line W1 and the second wiring line W2 is not limited to the above-described embodiment, and can be arbitrarily changed. At the same time, the first wiring W1 and the second wiring W2 are not limited to a constant pitch, and may be arranged at a random pitch. Further, the third wiring W3 is not limited to the second wiring W2, and may be arranged at a position overlapping the first wiring W1.

In the embodiment, the mounting pad MP2B has two convex portions of the first reinforcing pattern PR1 and the second reinforcing pattern PR2 extending from the circular pad in the opposite directions. However, the present invention is not limited thereto, and only a single reinforcing pattern may be provided.

Figure 10:
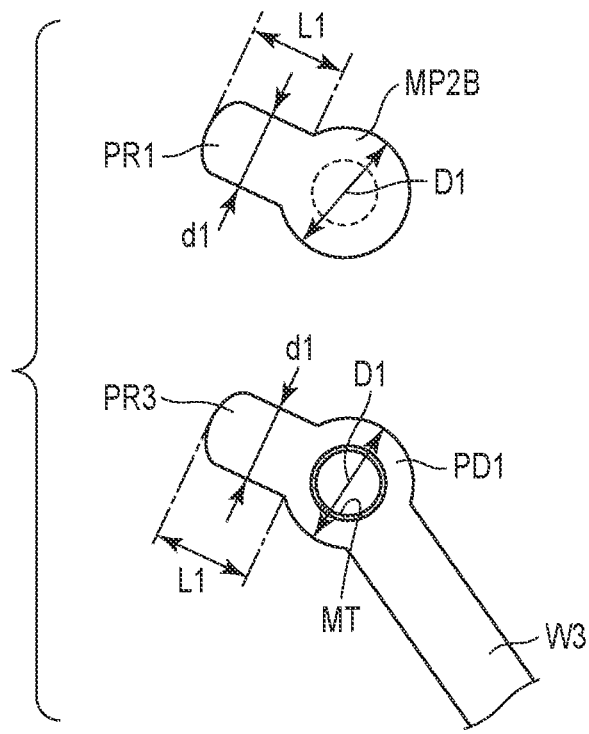
FIG. 10 is a plan view schematically illustrating a mounting pad and a lower layer wiring of a joint portion according to a modification.

FIG. 10 is a plan view illustrating a mounting pad and a third wiring of a printed circuit board according to a modification. As illustrated in the drawing, according to the modification, the mounting pad MP2B includes only the first reinforcing pattern PR1 extending from the circular pad in the direction opposite to the wiring. The corresponding third wiring W3 of the lower layer has the pad portion PD1 and the third reinforcing pattern PR3 linearly extending from the pad portion PD1.

The mounting pad MP2B and the first reinforcing pattern PR1 are arranged to overlap the pad portion PD1 and the third reinforcing pattern PR3 of the third wiring W3 in the thickness direction. The mounting pad MP2B is connected to the pad portion PD1 of the third wiring W3 through the plating through hole MT.

According to the modification configured as described above, it is possible to obtain substantially the operation and effect similar to those of the above-described embodiment. By reducing the number of reinforcement patterns, the number of sites where the solder joining state can be confirmed is reduced, but the installation space of the mounting pad is reduced, and further downsizing can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, in the disk device, the number of magnetic disks is not limited to five, but may be four or less or six or more. It is sufficient if the number of suspension assemblies and the number of magnetic heads are increased or decreased according to the number of magnetic disks installed. The printed circuit board is not limited to the FPC unit of the HDD, and can be applied to circuit boards of various electric devices.

What is claimed is:

1. A printed circuit board comprising:
an insulating layer;
a first conductive layer which is provided on one surface of the insulating layer and includes connection pads, a first mounting pad, a second mounting pad, and a second wiring connecting the first mounting pad and one of the connection pads;
a second conductive layer which is provided on another surface of the insulating layer and includes a third wiring connected to one of the connection pads; and
a conductive via which is provided penetrating the second conductive layer and the insulating layer and connects the second mounting pad and the third wiring, wherein
the first conductive layer includes a first reinforcing pattern extending from the second mounting pad in a direction different from a direction of the third wiring, and
the second conductive layer includes a pad portion provided on the third wiring and opposed to the second mounting pad with the insulating layer interposed therebetween, and a third reinforcing pattern extending from the pad portion and opposed to the first reinforcing pattern with the insulating layer interposed therebetween.

2. The printed circuit board of claim 1, wherein
the third wiring opposes to the second wiring with the insulating layer interposed therebetween.

3. The printed circuit board of claim 1, further comprising a mounting region on which a semiconductor element is mounted is provided, wherein
the first mounting pad and the second mounting pad are arranged side by side in the mounting region.

4. The printed circuit board of claim 1, wherein
the first mounting pad and the second mounting pad are alternately arranged side by side in one direction.

5. The printed circuit board of claim 4, wherein
the first conductive layer includes a first wiring, and the first wiring and the second wiring are alternately arranged side by side in the one direction.

6. The printed circuit board of claim 1, wherein
the conductive via includes a through hole penetrating the pad portion of the second conductive layer and the insulating layer and opposing to the second mounting pad, and a plating layer formed to overlap the pad portion, an inner surface of the through hole, and the second mounting pad.

7. The printed circuit board of claim 1, wherein
an extension length and a width of the first reinforcing pattern substantially coincide with an extension length and a width of the third reinforcing pattern.

8. The printed circuit board of claim 1, wherein
the first conductive layer includes a second reinforcing pattern extending from the second mounting pad in a direction different from a direction of the first reinforcing pattern and opposing to the third wiring with the insulating layer interposed therebetween.

9. The printed circuit board of claim 8, wherein
the second reinforcing pattern has a width common to a line width of the third wiring.

10. A disk device comprising:
a disk-shaped recording medium;
a magnetic head which processes information on the recording medium;
an actuator assembly which movably supports the magnetic head with respect to the recording medium; and
the printed circuit board of claim 1 connected to the actuator assembly.

11. The disk device of claim 10, further comprising an electronic component mounted on the first mounting pad and the second mounting pad, wherein
the actuator assembly comprises a wiring member connected to the magnetic head, and the wiring member includes a connection end portion joined to the connection pads of the printed circuit board.

* * * * *